United States Patent
Zhu et al.

(10) Patent No.: US 8,282,381 B1
(45) Date of Patent: Oct. 9, 2012

(54) NANOIMPRINT RESIST, NANOIMPRINT MOLD AND NANOIMPRINT LITHOGRAPHY

(75) Inventors: Zhen-Dong Zhu, Beijing (CN); Qun-Qing Li, Beijing (CN); Li-Hui Zhang, Beijing (CN); Mo Chen, Beijing (CN)

(73) Assignees: Tsinghua University, Beijing (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 13/459,346

(22) Filed: Apr. 30, 2012

Related U.S. Application Data

(62) Division of application No. 12/712,178, filed on Feb. 24, 2010, now Pat. No. 8,202,468.

(30) Foreign Application Priority Data

Jun. 9, 2009 (CH) .............................. 200910108044
Jun. 9, 2009 (CH) .............................. 200910108046
Jun. 9, 2009 (CH) .............................. 200910108047

(51) Int. Cl.
*B29C 33/38* (2006.01)

(52) U.S. Cl. ...................... 425/385; 425/174; 425/174.4; 425/383; 425/403; 264/293; 264/225; 264/226; 264/227

(58) Field of Classification Search .................. 425/383, 425/385, 403, 174, 174.4; 264/293, 225, 264/226, 227
See application file for complete search history.

(56) References Cited

U.S. PATENT DOCUMENTS

| | | | |
|---|---|---|---|
| 2001/0003384 A1* | 6/2001 | Morita | 425/192 R |
| 2008/0248205 A1* | 10/2008 | Blanchet et al. | 427/282 |
| 2008/0277826 A1* | 11/2008 | Chou et al. | 264/293 |

* cited by examiner

*Primary Examiner* — Joseph Del Sole
*Assistant Examiner* — Timothy Kennedy
(74) *Attorney, Agent, or Firm* — Altis Law Group, Inc.

(57) ABSTRACT

A nanoimprint mold includes a flexible body and a molding layer formed on the flexible body. The molding layer includes a plurality of protrusions and recesses. The molding layer is a polymer material polymerized via a cross linking polymerization of a nanoimprint resist which includes a hyperbranched polyurethane oligomer (HP), a perfluoropolyether (PFPE), a methylmethacrylate (MMA), a diluent solvent and a photo initiator.

8 Claims, 27 Drawing Sheets

NANOIMPRINT RESIST, NANOIMPRINT MOLD AND NANOIMPRINT LITHOGRAPHY

RELATED APPLICATIONS

This application claims all benefits accruing under 35 U.S.C. §119 from China Patent Application No. 200910108044.5, 200910108046.4 and 200910108047.9 filed on Jun. 9, 2009 in the China Intellectual Property Office. This application is a divisional of U.S. patent application Ser. No. 12/712,178, filed on Feb. 24, 2010 now U.S. Pat. No. 8,202,468 entitled, "NANOIMPRINT RESIST, NANOIMPRINT MOLD AND NANOIMPRINT LITHOGRAPHY". The disclosures of the above-identified applications are incorporated herein by reference.

BACKGROUND

1. Technical Field

This disclosure relates to nanoimprint resist, nanoimprint mold, and nanoimprint lithography.

2. Description of Related Art

In fabricating semiconductor integrated electrical circuits, integrated optical, magnetic, mechanical circuits, micro devices, and the like, lithography is one of the key processing methods. Lithography creates a pattern in a thin film located on a substrate, so that, in subsequent process steps, the pattern will be replicated in the substrate or in another material located on the substrate.

Nanoimprint lithography (NIL) is a simple nanolithography process with low cost, high throughput and high resolution. It creates patterns by mechanical deformation of imprint resist and subsequent processes. The imprint resist is typically a monomer or polymer formulation that is cured by heat or UV light during the imprinting. Adhesion between the resist and the template is controlled to allow proper release. There are many different types of nanoimprint lithography, including thermoplastic nanoimprint lithography and photo nanoimprint lithography.

Thermoplastic nanoimprint lithography (T-NIL) is the earliest nanoimprint lithography developed by Prof. Stephen Chou's group. In a standard T-NIL process, a thin layer of imprint resist (thermoplastic polymer) is spin coated onto the sample substrate. Then the mold, which has predefined topological patterns, and the sample are pressed together under a certain pressure. When heated up above the glass transition temperature of the polymer, the pattern on the mold is pressed into the softened polymer film. After being cooled down, the mold is separated from the sample and the pattern resist is left on the substrate. A pattern transfer process (e.g. reactive ion etching) can be used to transfer the pattern in the resist to the underneath substrate.

In photo nanoimprint lithography (P-NIL), a photo (UV) curable liquid resist is applied to the sample substrate and the mold is normally made of transparent material (e.g. fused silica). After the mold and the substrate are pressed together, the resist is cured in UV light and becomes solid. After mold separation, a similar pattern transfer process can be used to transfer the pattern in resist onto the underneath material.

However, the central goal in today's nanoimprint lithography is to make NIL appropriate to mass-productions for improving NIL performance and yield. Modification of row materials referred to as mold material and resist. As far as the resist, lithography generally employed it as mask of different processes, because of it properties of thermal plastic, UV curing and easy removal such as polymethyl methacrylate (PMMA), PS, and HSQ and so on. Otherwise, due to the resist's low modulus, poor solvent resistance, high thermal expansion coefficient, and uneasily patterned, these disadvantages lead to distortions and deformations of the resident imprinting nanostructures. The materials for mold, quartz and Si or SiO2 wafer were usually applied, while this kind of mold generally fabricated by electronic beam lithography (EBL), it is easily crushed under high pressure.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
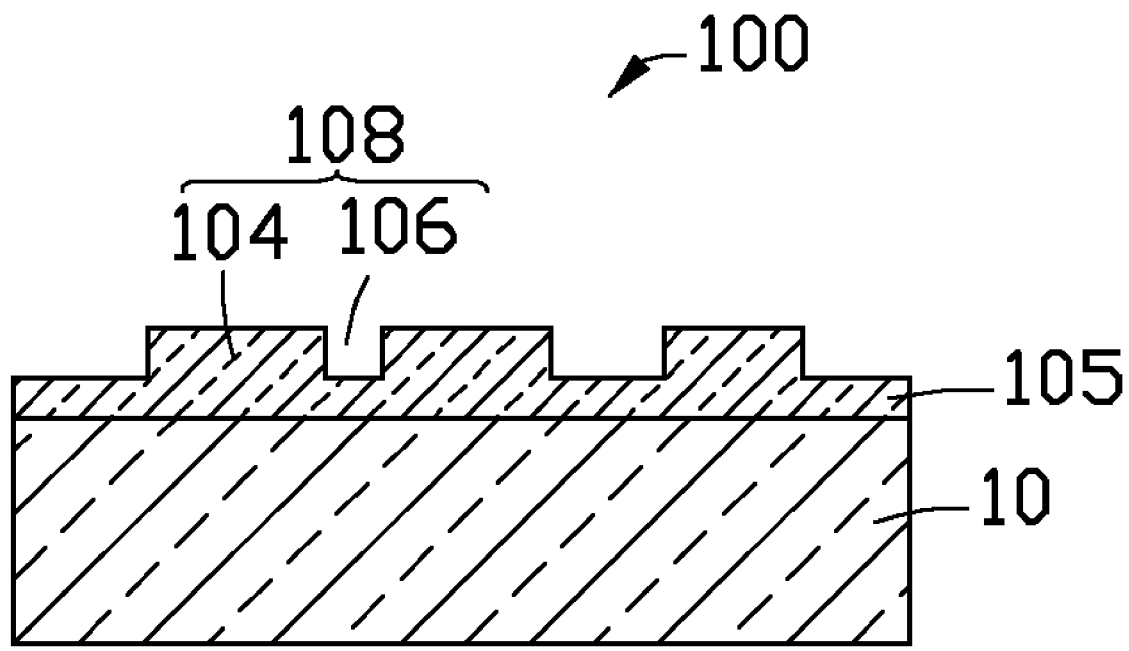
FIG. 1 is a schematic structural view of one embodiment of a flexible nanoimprint mold.

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Nanoimprint Resist

A nanoimprint resist of one embodiment of includes a hyperbranched polymer oligomer (HP), a perfluoropolyether (PFPE), a methylmethacrylate (MMA), and a diluent solvent. In the nanoimprint resist, the weight percent (wt %) of the HP is in a range from about 50 wt % to about 60 wt %. The wt % of the PFPE is in a range from about 3 wt % to about 5 wt %. The wt % of the MMA is in a range from about 5 wt % to about 10 wt %. The wt % of the diluents solvent is in a range from about 25 wt % to about 35 wt %.

The chemical structure of the PFPE is

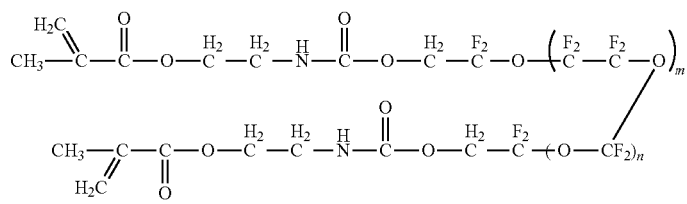

wherein m:n is in a range from about 0.6 to about 1.

If the nanoimprint resist is used in T-NIL, the HP can be formed by a copolymerization of the trimellitic anhydride, ethylene glycol, epoxy acrylic acid copolymer, or can also be formed by a ring-opening copolymerization of epoxy acrylic acid and ethylene mercaptan. The chemical structure of the HP is

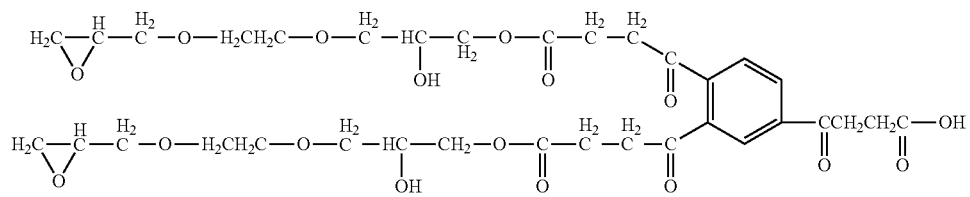

If the nanoimprint resist is used in P-NIL, the HP can be formed by a copolymerization of the trimellitic anhydride, ethylene mercaptan, and epoxy acrylic acid, or can also be formed by a ring-opening copolymerization epoxy acrylic acid and ethylene glycol. In one embodiment, the chemical structure of the HP is

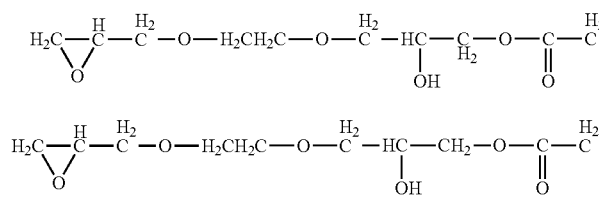

The diluent solvent can be 2-hydroxyethyl methacrylate or 2-Hydroxy Ethyl 2-methyl ethylene. The nanoimprint resist can further include polydimethlsiloxanes (PDMS) or methacrylatesilane with a wt % in a range from about 5% to about 10%, to enhance the adhesion between the substrate and the nanoimprint resist. The nanoimprint resist may include an initiator with a wt % in a range from about 0.1% to about 2%. The initiator can be thermal initiator or photo initiator, thus the nanoimprint resist can be heat cured or photo cured. In one embodiment, a chemical structure of the photo initiator is

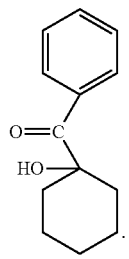

The nanoimprint resist can be made by the method of mixing HP, with wt % ranging from about 50 wt % to about 60 wt %, PFPE, with wt % ranging from about 3 wt % to about 5 wt %, MMA, with wt % ranging from about 5 wt % to about 10 wt %, diluent solvent, with wt % ranging from about 25 wt % to about 35 wt %, and initiator, with wt % ranging from about 0.1 wt % to about 2 wt %, standing for about 1 hour to 3 hours to form a mixture, and filtering the mixture through a 0.2 pm syringe filter after mixing for more than 2 hours to form a nanoimprint resist as a uniform liquid resin.

It is also understood that polydimethlsiloxanes (PDMS) or methacrylatesilane with a wt % in a range from about 5% to about 10% can be added in the mixture to enhance the adhesion between a substrate and the nanoimprint resist when the nanoimprint resist is in use.

Sufficient low surface energy and high modulus are the two critical factors for NIL. In the nanoimprint resist described-above, the macromolecular chain of $-(CF_2CF_2-O)_m-$ 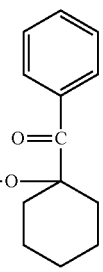 $(CF_2-O)_n-$ of PFPE contains perfluoropolyether and donates the facile surface energy. The cross linking polymerization is taken place among $CH_2=C(CH_3)COO-$ of PFPE, epoxy terminal groups of HP and the diluters. Broadly cross-linking among these regents is facilitated to solidify the Young's modulus of composition. Thus, the nanoimprint resist described-above have high modulus, rich solvent resistance, low thermal expansion coefficient and are easily patterned.

Flexible Nanoimprint Mold

Referring to FIG. 1, a flexible nanoimprint mold 100 of one embodiment used in NIL includes a flexible body 10 and a molding layer 105 formed on a flexible body 10. The molding layer 105 includes a plurality of protrusions 104 having a desired shape and a recess 106 defined between adjacent protrusions 104. The plurality of protrusions 104 and recesses 106 cooperatively form a nanopattern 108.

The flexible body 10 can be a flat plate. The shape and size of the flexible body 10 is not limited and can be prepared according to actual needs. The flexible body 10 can be made of flexible transparent polymer materials, such as silicone rubber, polyurethane, epoxy resin, poly methyl methacrylate, and polyethylene terephthalate (PET). In one embodiment, the flexible body 10 is a square flat plate with a diameter of about 4 inches made of PET.

A width of the plurality of protrusions 104 and recesses 106 can be in a range from about 50 nanometers to about 200 nanometers. The molding layer 105 is a polymer material formed via a cross linking polymerization of the nanoimprint resist used in the photo nanoimprint lithography (P-NIL). The nanoimprint resist used in the P-NIL is described above in detail.

The macromolecular chain of $-(CF_2CF_2-O)_m-(CF_2-O)_n-$ of PFPE contains perfluoropolyether and donates the facile surface energy. The cross linking polymerization may take place among $CH_2=C(CH_3)COO-$ of PFPE, epoxy terminal groups of HP and the diluters. Broadly cross-linking among these regents may facilitate to solidify the Young's modulus of the molding layer 105. Sufficient low surface energy and high modulus are two important factors for NIL. The former contributes to easily releasing, the later keep the nanopattern 108 durable, and both of them render that the flexible mold 100 could keep the primal morphology without defects and contamination for long time utilizing.

Figure 2:
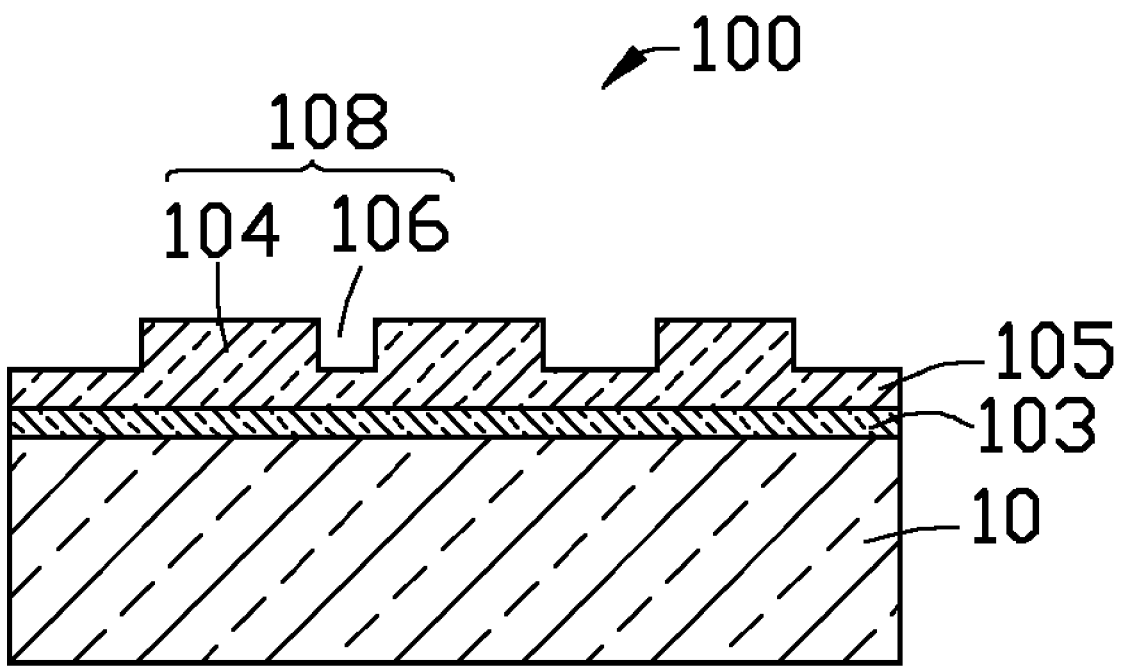
FIG. 2 is a schematic structural view of one embodiment of a flexible nanoimprint mold.

Referring to FIG. 2, the flexible nanoimprint mold 100 can further include an adhesive layer 103 located between the molding layer 105 and the flexible body 10. Thus the adhesion between the molding layer 105 and the flexible body 10 can be enhanced. In one embodiment, the adhesive layer 103 is made of methacrylatesilane.

Figure 3A:
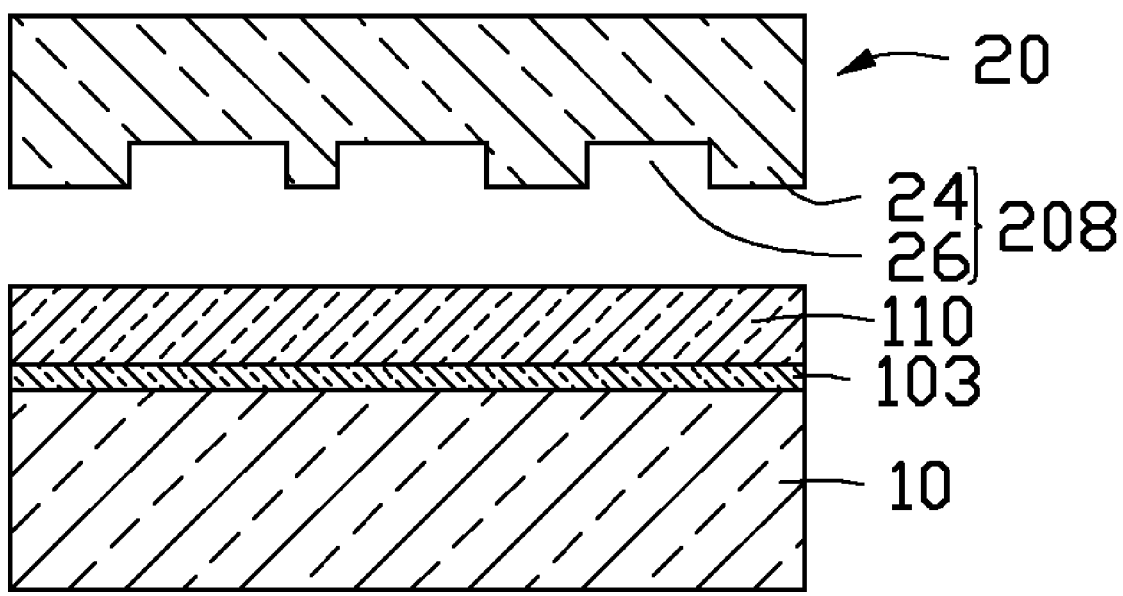
FIGS. 3A through 3C are sectional views of one embodiment of a method for manufacturing the flexible nanoimprint mold shown in FIG. 1.
Figure 3B:
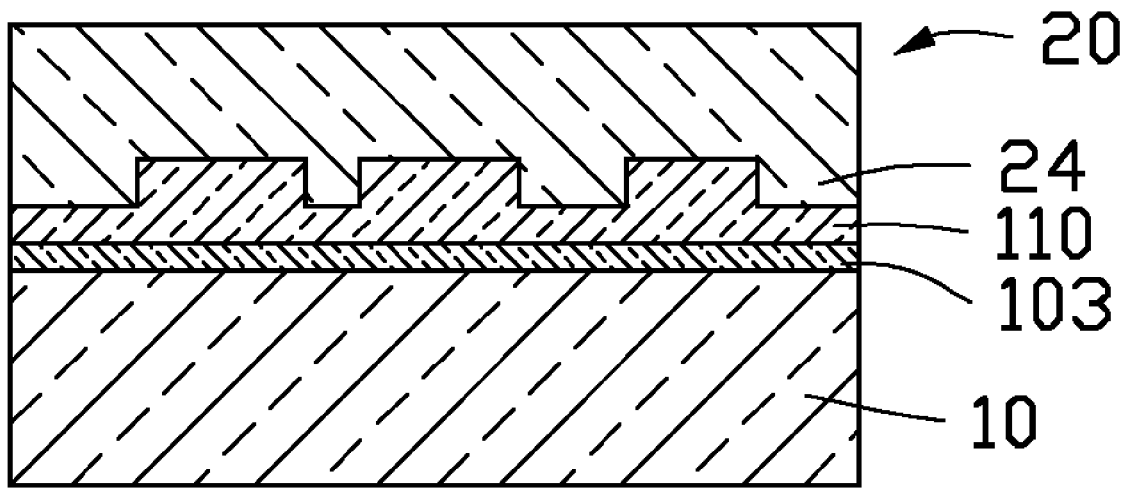
Figure 3C:
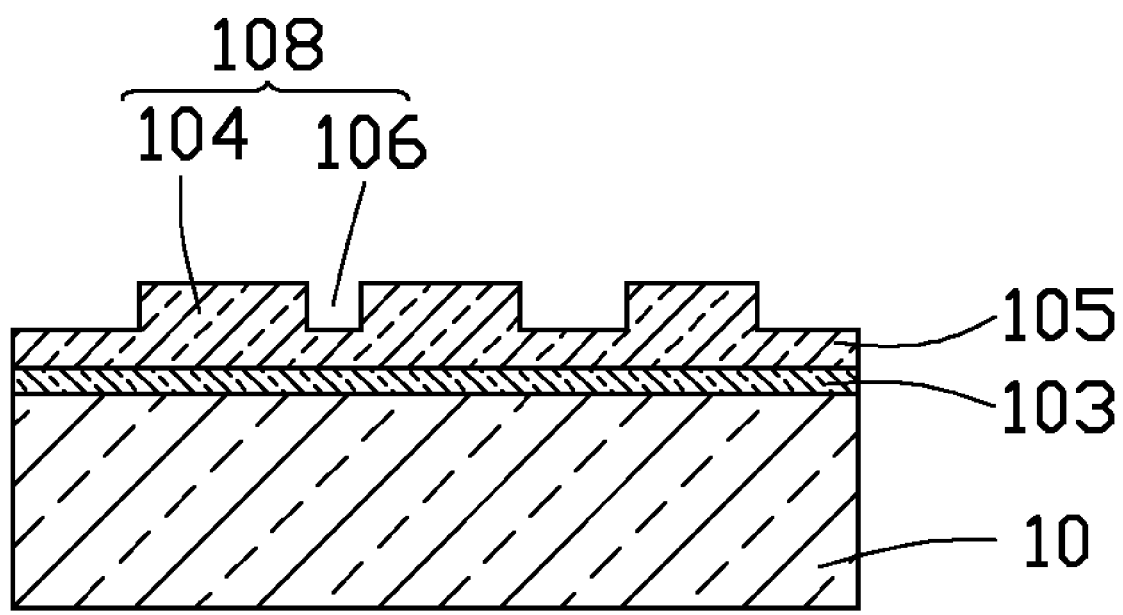
Figure 4A:
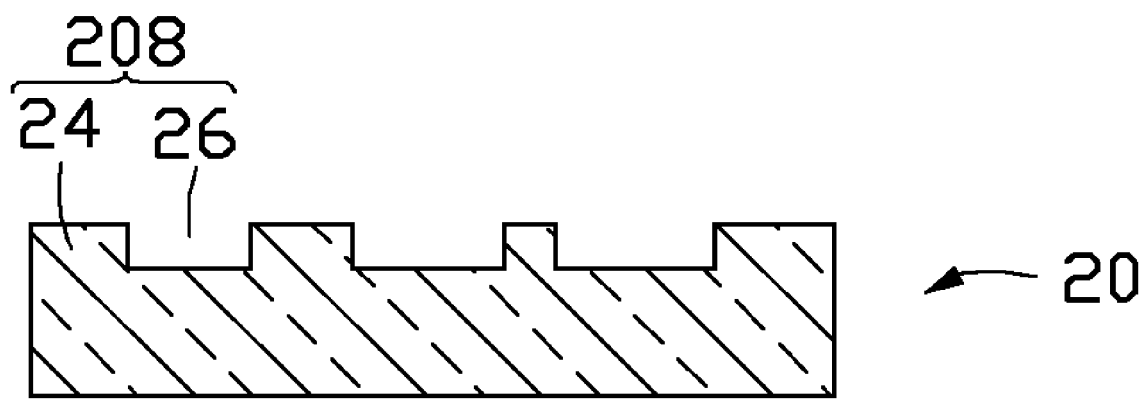
FIGS. 4A through 4D are sectional views of one embodiment of a method for manufacturing the flexible nanoimprint mold shown in FIG. 1.
Figure 4B:
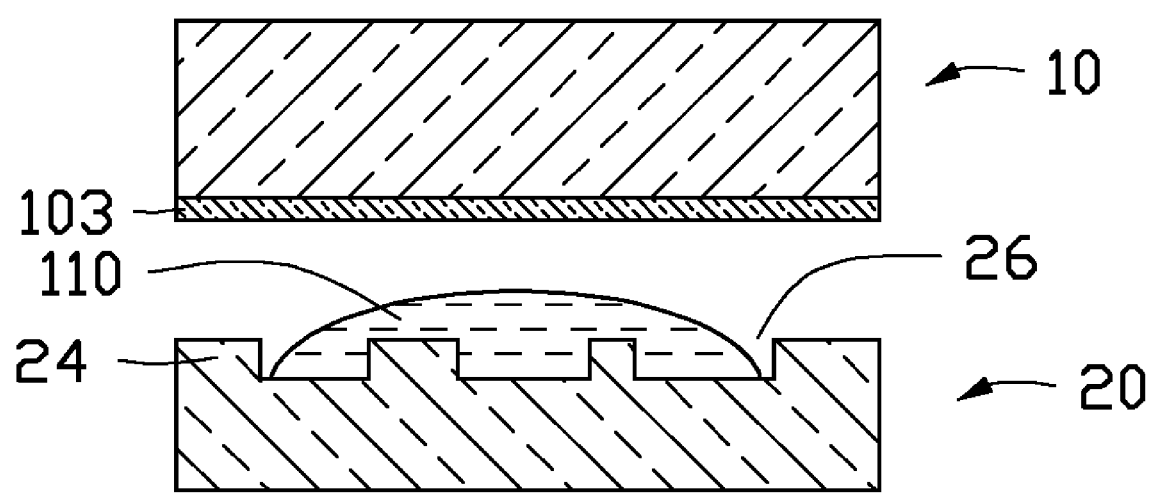
Figure 4C:
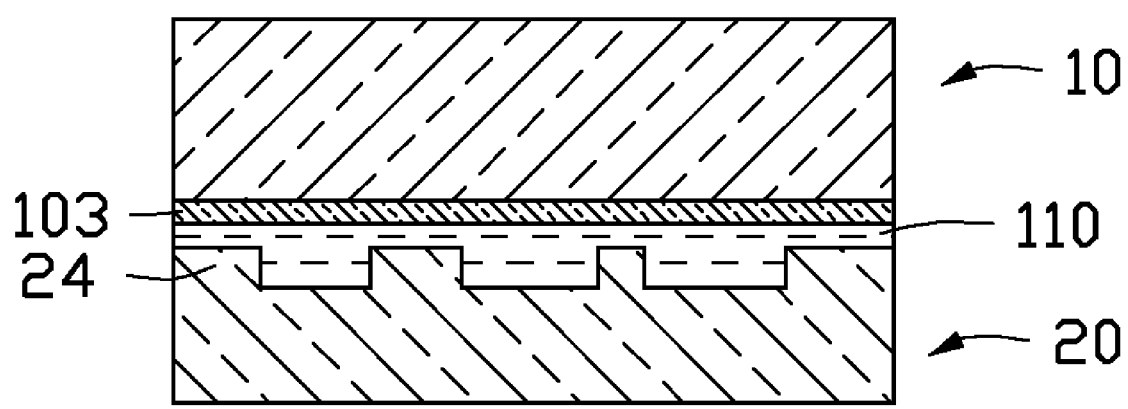
Figure 4D:
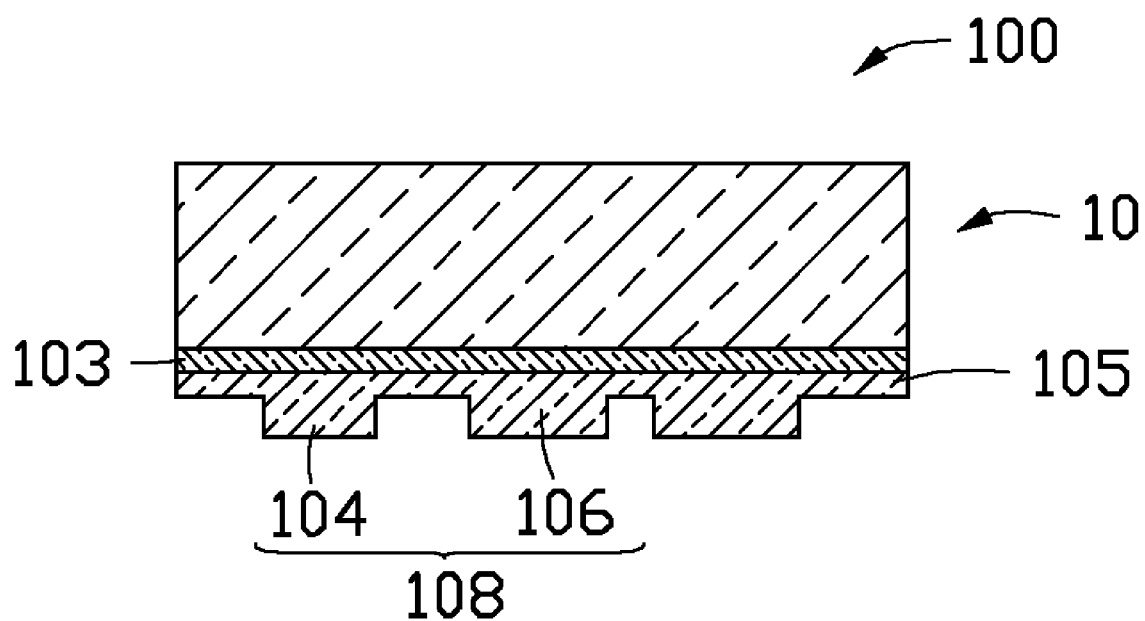

Referring to FIGS. 3A to 3C, a method of one embodiment for making the flexible nanoimprint mold 100 includes:

(S11) providing a flexible body 10, depositing a polymer compound 110 on the flexible body 10;

(S12) providing a master stamp 20 having a nanopattern 208, pressing the nanopattern 208 into the polymer compound 110 of the flexible body 10; and (S13) curing the polymer compound 110, separating the master stamp 20 from the flexible body 10 to form a molding layer 105 on the flexible body 10.

In step (S11), the polymer compound 110 can be the nanoimprint resist used in P-NIL. The polymer compound 110 can be formed on the flexible body 10 through any appropriate technique such as screen printing and spin casting. The polymer compound 110 has a thickness ranging from about 100 nanometers to about 300 nanometers. In one embodiment, the polymer compound 110 is formed via spin casting. The spin-coating speed is in a range from about 5400 Round Per minute (RPM) to about 7000 RPM, the time is from about 0.5 minutes to about 1.5 minutes. The polymer compound 110 can be baked about 3 to 5 minutes at a temperature of about 140° C. to about 180° C.

In some embodiments, an adhesive layer 103 can be deposited on the flexible body 10 before forming the polymer compound 110 via spin casting. The polymer compound 110 is deposited on the adhesive layer 103. Thus the adhesion between the flexible body 10 and the polymer compound 110 can be enhanced. In one embodiment, the adhesive layer 103 is made of methacrylatesilane.

In step (S12), the master stamp 20 includes a plurality of projecting portions 24 and a plurality of gaps 26. One gap 26 is defined between adjacent projecting portions 24. The plurality of projecting portions 24 and gaps 26 forms a nanopattern 208. The master stamp 20 can be a transparent rigid material, such as silicon dioxide, silicon, quartz, and glass diboride, to be hard relative to the polymer compound 110. The master stamp 20 can be patterned with the projecting portions 24 and gaps 26, using electron beam lithography, reactive ion etching (RIE) and other appropriate methods. A depth of projecting portions 24 can be in a range from about 5 nm to about 200 nm, depending upon the desired lateral dimension. A width of the gaps 26 and the projecting portions 24 can be in a range from about 50 nanometers to about 200 nanometers. In one embodiment, the master stamp 20 is made of quartz.

In one embodiment, the master stamp 20 is fabricated using electron beam lithography (EBL), metal lift-off and then dry RIE processes. Nanoscale patterns of about 50 nm×200 nm pitch are formed in a ZEP520A resist on the quartz samples using EBL. Typical EBL processes are carried out beam energy of 100 keV, beam current of about 200 pA, and cold development in ZED-N50. After the development of ZEP520A patterns, 40 nm thick Cr is evaporated on the sample and a lift-off process is performed in butanone in an ultrasonic bath for about 5 min to transfer the ZEP520A patterns to the Cr layer. Using the Cr gratings as a mask, reactive ion etching using pure $CF_4$ is performed with power of 40 W, 2 Pa, $CF_4$ 40 sccm. After the Cr residual is stripped away, the patterned quartz works as the master stamp 20.

Referring to FIG. 3B, in step (S12), the master stamp 20 can be pressed into the polymer compound 110 to form a plurality of recesses 106 in the polymer compound 110. Each recess 106 corresponds to one projecting portion 24 of the master stamp 20. Step (S12) can be performed in a vacuum environment to make the polymer compound 110 can be fully filled into the entire gaps 26 of the master stamp 20. In one embodiment shown in FIGS. 3A-3C, projecting portions 24 are not pressed all of the way into the polymer compound 110 and do not contact the flexible body 10.

In step (S13), the polymer compound 110 is cured via UV light and becomes solid. In one embodiment, UV curing step is carried out on the conditions of 17 mJ*$cm^{-2}$ and 10 seconds (sec). After peeling of the master stamp 20 from the flexible body 10, the molding layer 105 is formed on the flexible body 10. The molding layer 105 includes a plurality of protrusions 104 and recesses 106. Each protrusion 104 corresponds to one gap 26 of the master stamp 20. The recesses 106 form reliefs which conform generally to the shape of the projecting portions 24 of the master stamp 20. The plurality of protrusions 104 and recesses 106 form the nanopattern 108.

Referring to FIGS. 4A to 4D, a method of one embodiment for making the flexible nanoimprint mold 100 includes:

(S21) providing a master stamp 20 having a nanopattern 208 and a flexible body 10;

(S22) depositing a polymer compound 110 to cover the nanopattern 208;

(S23) applying the flexible body 10 to the polymer compound 110 and compressing the flexible body 10 and the master stamp 20; and (S24) curing the polymer compound 110, separating the flexible body 10 and the master stamp 20 to form a molding layer 105 on the flexible body 10.

In step (S22), before depositing the polymer compound 110, the master stamp 20 can be pretreated by immersing the master stamp 20 in a piranha solution for about 30 min, and self-assembling a fluorinated monolayer molecular membrane of F13-TDS under 250° C. for about 30 min and rinsing with hexane as needed. Step (S22) can be performed in a vacuum environment to make the polymer compound 110 can be fully filled in the entire gaps 26 of the master stamp 20.

In step (S23), an adhesive layer 103 can be deposited on the flexible body 10 before applying the flexible body 10 to the polymer compound 110, to enhance the adhesion between the flexible body 10 and polymer compound 110. In one embodiment, the adhesive layer 103 is made of methacrylatesilane.

The flexible nanoimprint mold 100 employ HPFPE as flexible mold materials. Hyperbranched polymer (HP) is applied to intermediate PFPE to achieve the HPFPE with enough viscosity, low surface energy, modulus and stability. In which, the backbone of fluorinated polyether with $-(CF_2CF_2O)_m-(CF_2O)_n-$ generates low surface energy for NIL releasing. The ending groups acrylic structures $CH_2=C(CH_3)COO-$ of PFPE may produce the modulus by cross-linking itself with epoxy groups of HP oligomer, which also modifies the viscosity and fluidness of the mixture. Two monomer, benzyl methacrylate and 2-hydroxyethyl methacrylate, are applied in the mixture. Using the flexible nanoimprint mold, the results can be repeatable imprinting more than fifty times without any contamination, the near zero residual of photoresist imprinting groove, smooth surface, vertical sidewall, 50 nm line-width, and 200 nm period patterns on flexible substrate ITO/PET film.

Nanoimprint Lithography (NIL)

Referring to FIGS. 5A to 5G, one embodiment of a method of NIL includes:

(S31) providing a substrate 30 and orderly forming a first sacrifice layer 310, a second sacrifice layer 320 and a resist 330 on the substrate 30;

(S32) providing a master stamp 20 with a nanopattern 208, pressing the nanopattern 208 into the resist 330, and forming a nanopattern 308 in the resist 330; and (S33) transferring the nanopattern 308 to the substrate 30. Step (S31) further includes substeps of:

(S311) depositing the first sacrifice layer 310 on a top surface of the substrate 30;

(S312) forming the second sacrifice layer 320 covering the first sacrifice layer 310; and (S313) coating the resist 330 on a top surface of the second sacrifice layer 320.

In step (S311), the substrate 30 can be a flexible or rigid flat plate. The shape and size of the substrate 30 is not limited and can be prepared according to actual needs. The substrate 30 can be made of flexible polymer materials, such as silicone rubber, polyurethane, epoxy resin, and PET. The substrate 30 can also be made of a rigid material, such as silicon dioxide, silicon, quartz, and glass diboride. A material of the first sacrifice layer 310 can be made of a thermoplastic polymer, such as PMMA, epoxy resin, unsaturated polyester resins and silicon ether resin. In one embodiment, the substrate 30 is made of silicon, the material of the first sacrifice layer 310 is PMMA.

The first sacrifice layer 310 can be formed through any appropriate technique such as screen printing and spin casting. The first sacrifice layer 310 has a thickness ranging from about 100 nanometers to about 300 nanometers. In one embodiment, the first sacrifice layer 310 is formed via spin casting. The spin-coating speed is in a range from about 5400 Round Per minute (RPM) to about 7000 RPM, the time is from about 0.5 minutes to about 1.5 minutes. The first sacrifice layer 310 can be baked about 3 to 5 minutes at a temperature of about 140° C. to 180° C.

In step (S312), the second sacrifice layer 320 can be made of metal, such as aluminum (Al) or cesium (Cr), and can be formed via electron-beam evaporation, sputtering or chemical vapor deposition. In one embodiment, the second sacrifice layer 320 is made of Al, and deposited on the top surface of the first sacrifice layer 310 via electron-beam evaporation. The evaporation speed is in a range from about 0.5 angstrom/minute (A/min) to about 1.5 angstrom/minute (A/min). A thickness of the second sacrifice layer 320 is in a range from about 30 nanometers to about 50 nanometers.

In step (S313), the resist 330 can be the nanoimprint resist used in P-NIL or T-NIL described above. The resist 330 can be deposited on a top surface of the second sacrifice layer 320 via screen printing or spin coating. The resist 330 may have a thickness ranging from about 100 nanometers to about 300 nanometers. In one embodiment, resist 330 is deposited via spin casting. The spin-coating speed is in a range from about 5400 Round Per minute (RPM) to about 7000 RPM, the time is from about 0.5 minutes to about 1.5 minutes. The resist 330 can be baked about 3 to 5 minutes at a temperature of about 140° C. to about 180° C.

The step (S32) includes substeps of:

(S321) compressing the master stamp 20 with the substrate 30 to press the nanopattern 208 into the resist 330; and (S322) curing the resist 330, and separating the master stamp 20 from the substrate 30 to form a nanopattern 308 in the resist 330.

In step (S321), the master stamp 20 is placed on the resist 330. Step (S321) can be performed in a vacuum environment to make sure the resist 330 can be fully filled into the entire gaps 26 of the master stamp 20. In one embodiment, the step (S321) is performed in a nanoimprinting machine. A vacuum of the nanoimprinting machine is 5.0E-03 millibar (mbar), after maintaining a pressure of about 12 pound/square inch (Psi) to about 15 Psi for about 5 to 10 minutes, the master stamp 20 is pressed into the resist 330, allowing the resist 330 filled with the gaps 26 of the master stamp 20.

In one embodiment, the resist 330 in step (S322) is the nanoimprint resist used in P-NIL descried above, and is cured via UV light and becomes solid. The UV curing is performed with a energy flux density of about 10 $mJ*cm^{-2}$ to about 17 $mJ*cm^{-2}$, an irradiating time of about 10 min to about 20 min, a vacuum of about 5.0E-03 mbar, and a pressure of about 50 Psi.

In another embodiment, the resist 330 in step (S322) is the nanoimprint resist used in T-NIL described above, and is cured via heating and becomes solid. The step (S322) can also be performed in a nanoimprinting machine. A temperature of the nanoimprinting machine can be in a range from about 45° C. to about 75° C. before pressing. A vacuum of the nano imprinting machine can be about 5.0E-03 millibar (mbar), after maintaining a pressure of about 12 pound/square inch (Psi) to about 15 Psi for about 5 to 10 minutes, the master stamp 20 can be pressed into the resist 330, allowing the resist 330 fully filled with the gaps 26 of the master stamp 20.

Figure 5A:
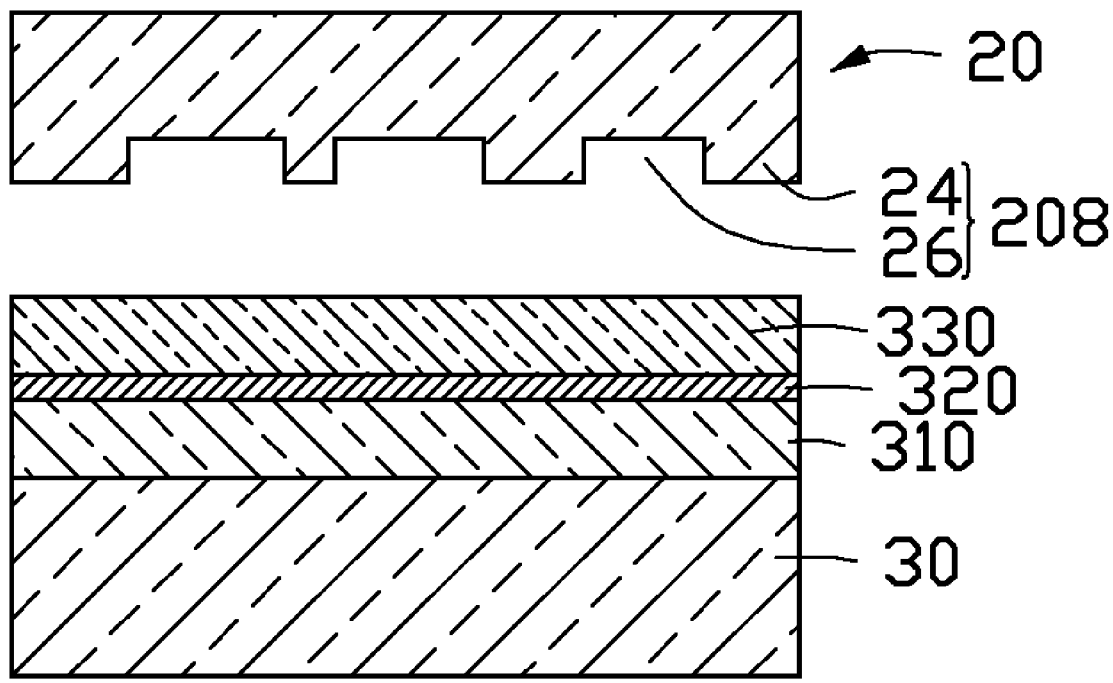
FIGS. 5A through 5G are sectional views of one embodiment of a method of Nanoimprint lithography (NIL).
Figure 5B:
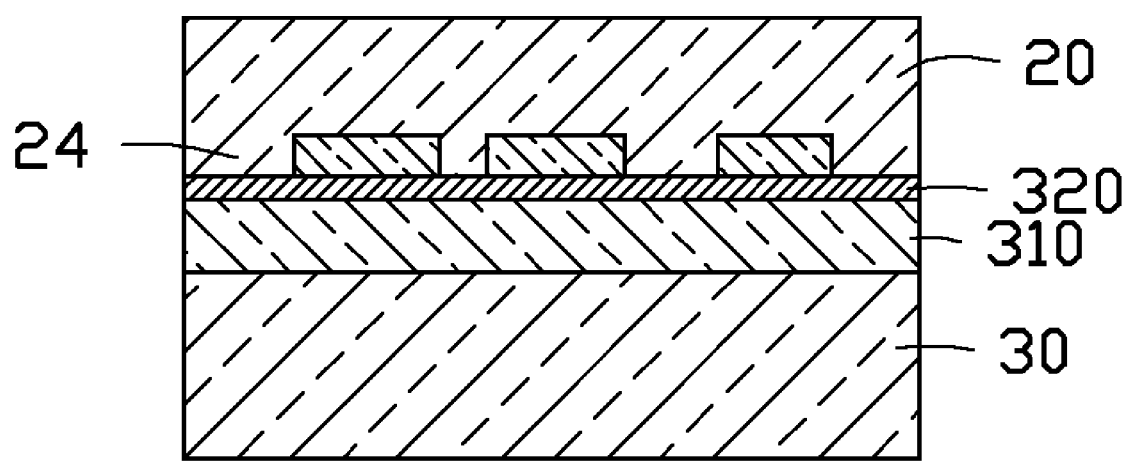
Figure 5C:
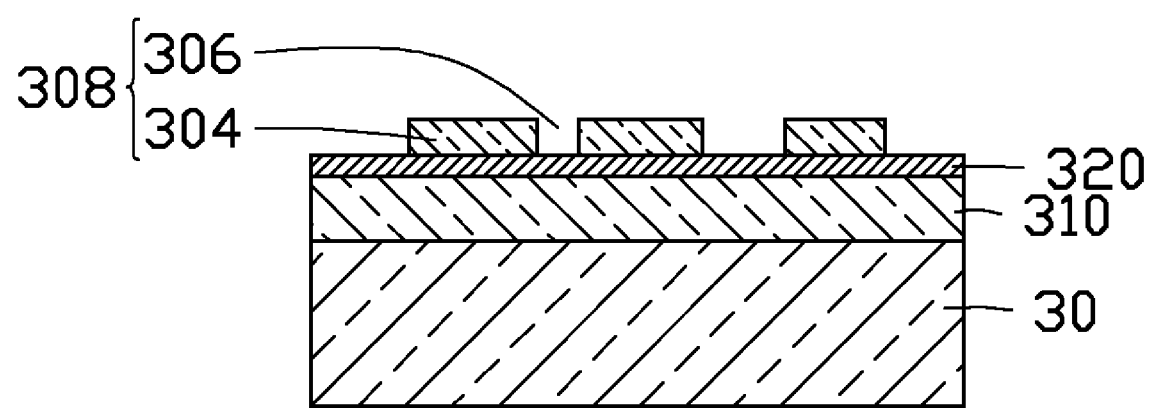
Figure 5D:
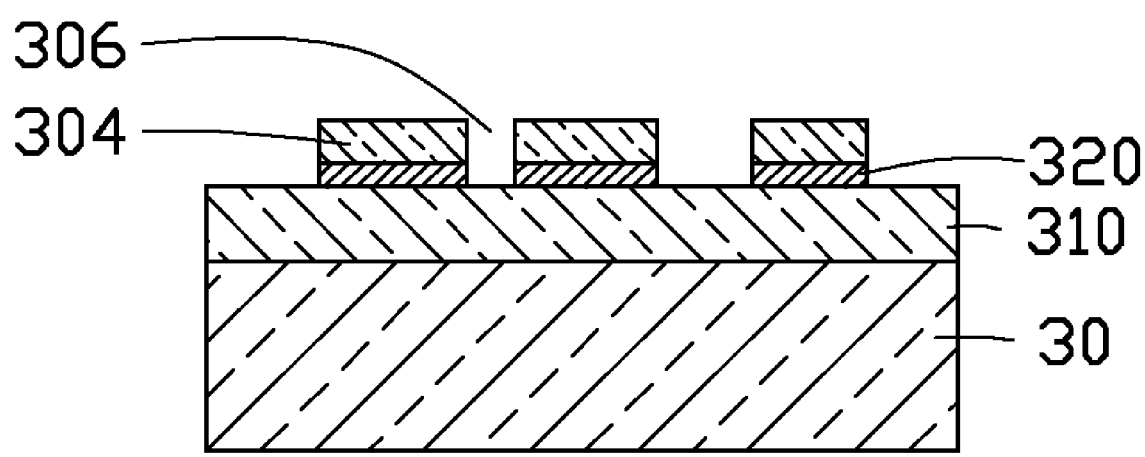
Figure 5E:
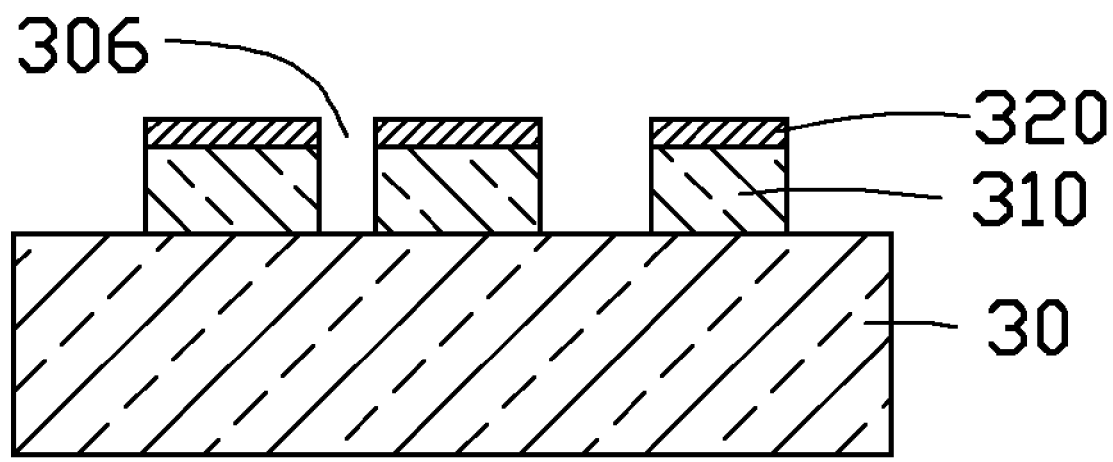

Referring to FIG. 5C, after separating the master stamp 20 from the substrate 30, a plurality of protrusions 304 and recesses 306 are exposed. Each protrusion 304 corresponds to one gap 26 of the master stamp 20. The recesses 306 form reliefs which conform generally to the shape of the projecting portions 24 and the master stamp 20. The plurality of protrusions 304 and recesses 306 form the nanopattern 308. It is easy to be understood that there may be remains (not shown) of resist 330 at the bottom of the recesses 306 after the step (S322).

In step (S33), the transferring process can be performed via etching method, step (S33) includes substeps of:

(S331) removing the remains of the resist 330 at the bottom of the recesses 306 to expose the second sacrifice layer 320 in part;

(S332) etching the second sacrifice layer 320 exposed by the recesses 306 to expose the first sacrifice layer 310 in part;

(S333) etching the first sacrifice layer 310 exposed by the recesses 306 to expose the substrate 30 in part; and (S334) etching the substrate 30 exposed by the recesses 306.

In step (S331), the remains of the resist 330 at the bottom of the recesses 306 can be removed via oxide plasma etching. In one embodiment, the substrate 30 is placed into a microwave induced plasma (MIP) device to etch the remains of the resist 330 at the bottom of the recesses 306. An induction power source of the MIP device emits oxide plasma. The oxide plasma has low ion power and etches the resist 330 for about 2 minutes to about 8 minutes, whereby, the remains of the resist 330 is etched and a portion of the second sacrifice layer 320 is exposed by the recesses 306. In one embodiment, the power of the MIP device is 60W and the speed of the oxide plasma is 40 sccm (standard-sate cubic centimeter per minute). The partial pressure of the oxide plasma is 2 Pa.

In step (S332), the second sacrifice layer 320 exposed by the recesses 306 can be removed via ion etching method. In one embodiment, the substrate 30 is placed into an inductively coupled plasma device, having a mixture of oxygen and chlorine to etch the second sacrifice layer 320 exposed by the recesses 306. In one embodiment, the power of the inductively coupled plasma device is 50 W, the speed of the chlorine is 24 sccm, and the speed of the silicon tetrachloride is 24 sccm. The partial pressure of the silicon tetrachloride and chlorine is 2 Pa.

In step (S332), in another embodiment, the substrate 30 is placed into a solution of $K_3[Fe(CN)_6]$ with a molality from about 0.06 mol/l to about mol/l, for about 4 minutes to 15 minutes. The second sacrifice layer 320, exposed by the recesses 30, is removed by the solution of $K_3[Fe(CN)_6]$. Thus first sacrifice layer 310 is partly exposed.

In one embodiment, the material of the second sacrifice layer 320 is Al, the step (S332) is performed via ion etching method. In some embodiments, the material of the second sacrifice layer 320 is Cr, the step (S332) is performed via ion etching method or wet etching method.

In step (S333), the first sacrifice layer 310 exposed by the recesses 30 is removed via oxide plasma etching, thus the substrate 30 is partly exposed out of the recesses 306. The oxide plasma etching in step (S333) is similar to that of step (S331).

In step (S333), the substrate 30 exposed by the recesses 306 is removed via reactive ion etching. In one embodiment, the substrate 30 placed into an inductively coupled plasma device, with a mixture of silicon tetrachloride and chlorine, to etch the exposed second semiconductor layer 150, the active layer 140, and the first semiconductor layer 130. The power of the inductively coupled plasma device is 50 W, the speed of the chlorine is 26 sccm, and the speed of the silicon tetrachloride is 4 sccm. The partial pressure of the silicon tetrachloride and chlorine is 2 Pa.

Figure 5F:
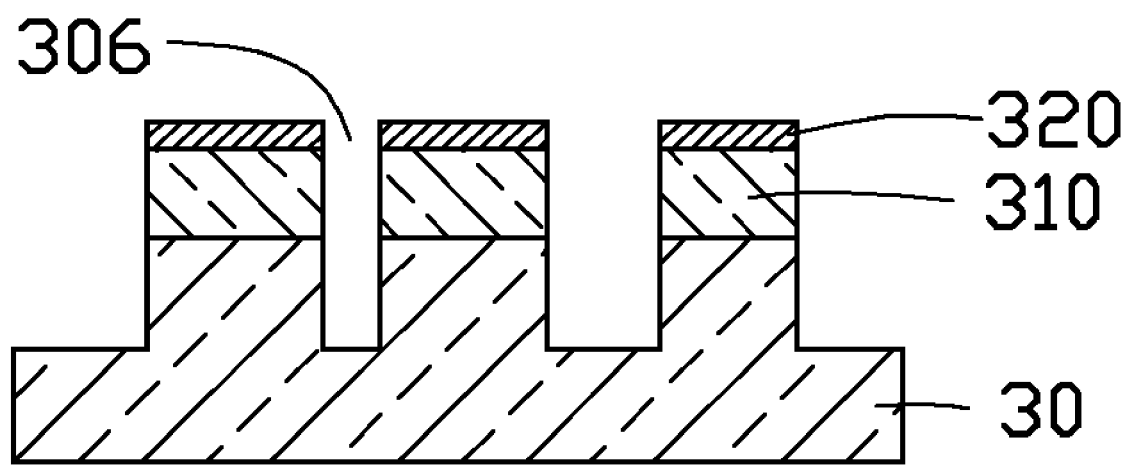
Figure 5G:
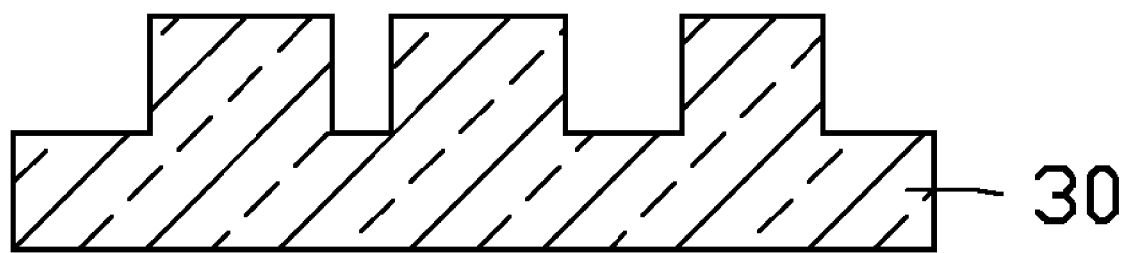

In step (S333), referring to FIG. 5F, the residue of the first sacrifice layer 310 can be washed away, and thus the residue of the second sacrifice layer 320, located on the residue of the first sacrifice layer 310, can also be removed.

Referring to FIGS. 6A to 6D, one embodiment of a method of NIL includes:

(S41) providing a substrate 30 and forming a resist 330 on the substrate 30;

(S42) providing a master stamp 20 with a nanopattern 208, pressing the nanopattern 208 into the resist 330, and forming a nanopattern 308 in the resist 330; and (S43) transferring the nanopattern 308 to the substrate 30.

Figure 6A:
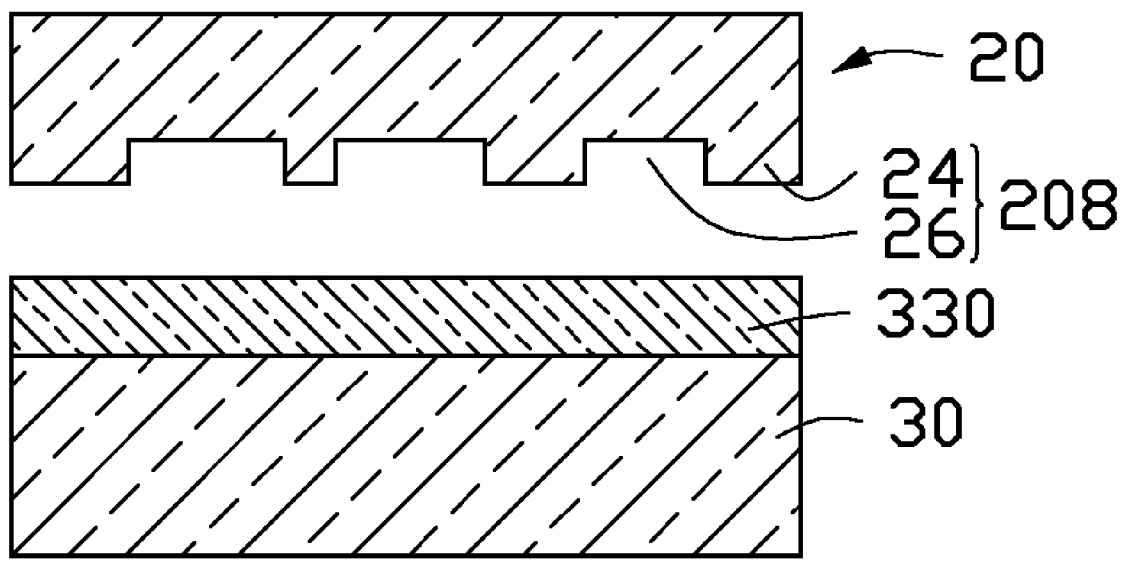
FIGS. 6A through 6D are sectional views of one embodiment of a method of NIL.

Referring to FIG. 6A, in step (S41), the resist 330 can be directly coated on the substrate 30 via a same method as that of step (S313). The resist 330 has a thickness ranging from about 100 nanometers to about 300 nanometers.

Figure 6B:
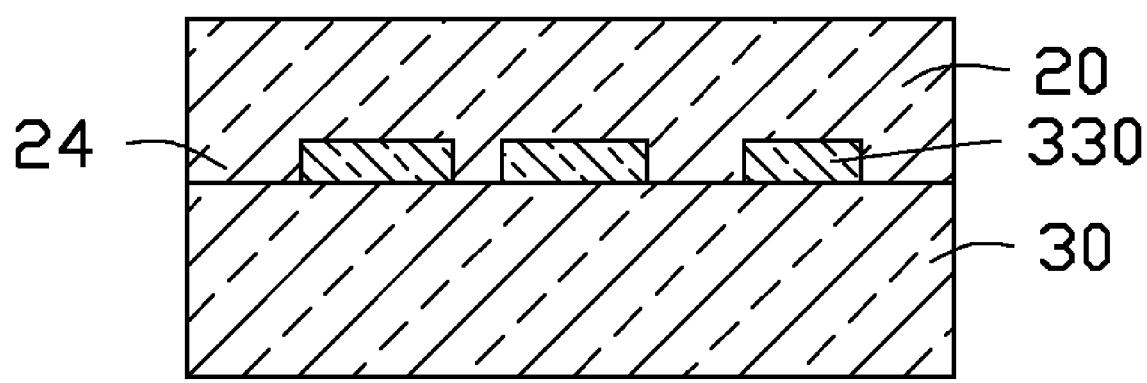
Figure 6C:
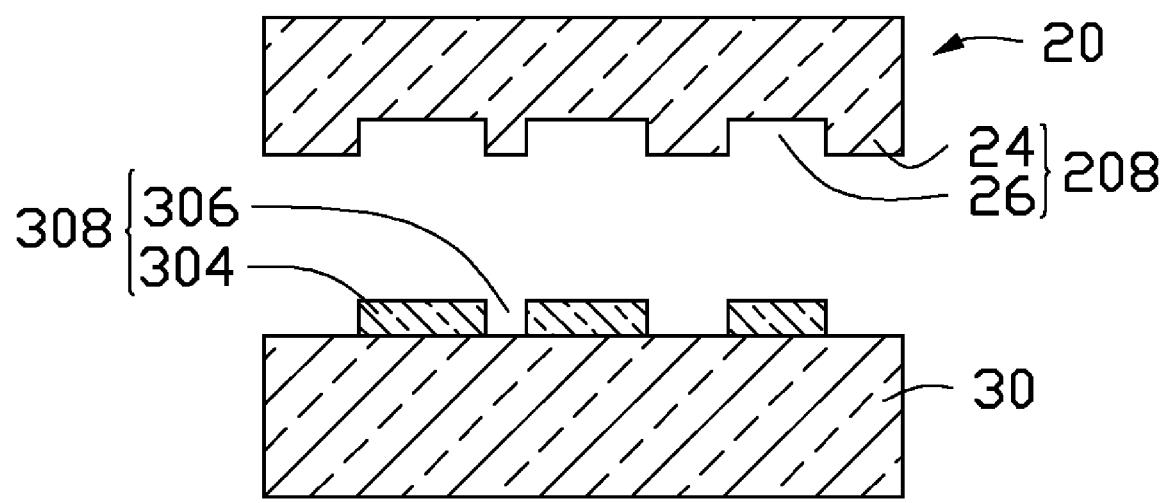
Figure 6D:
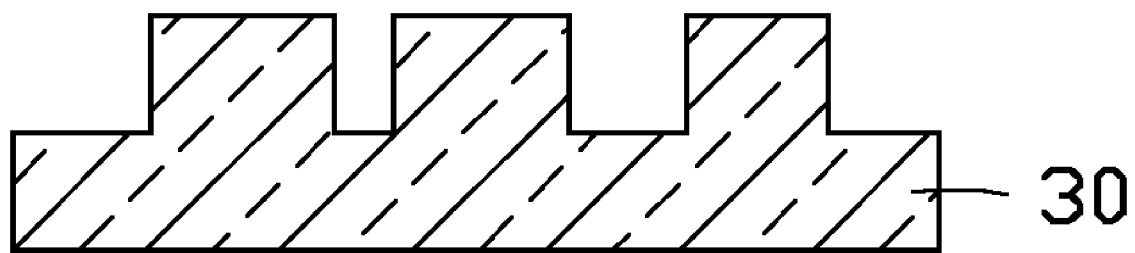
Figure 7A:
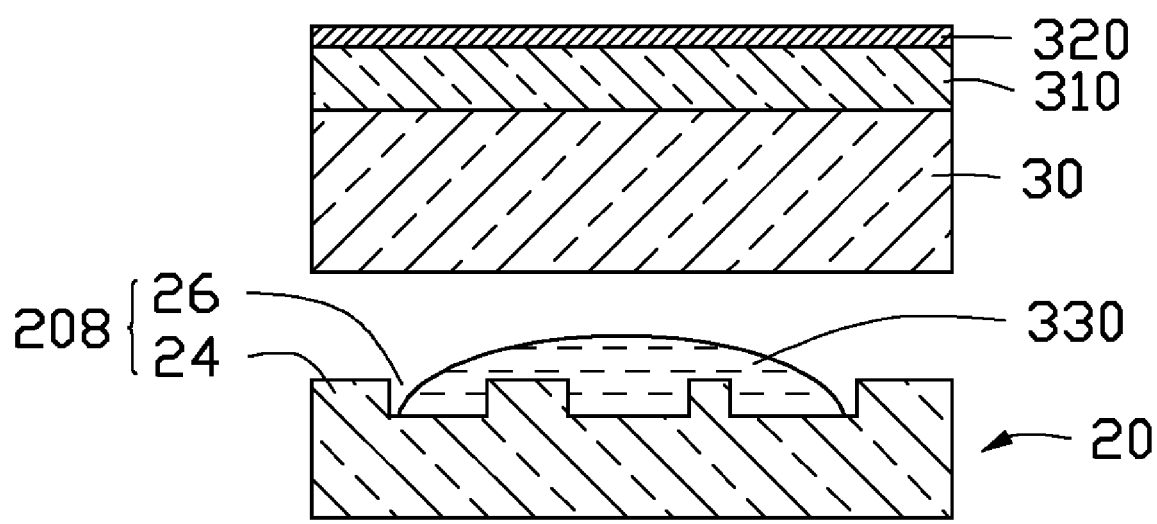
FIGS. 7A through 7G are sectional views of one embodiment of a method of NIL.
Figure 7B:
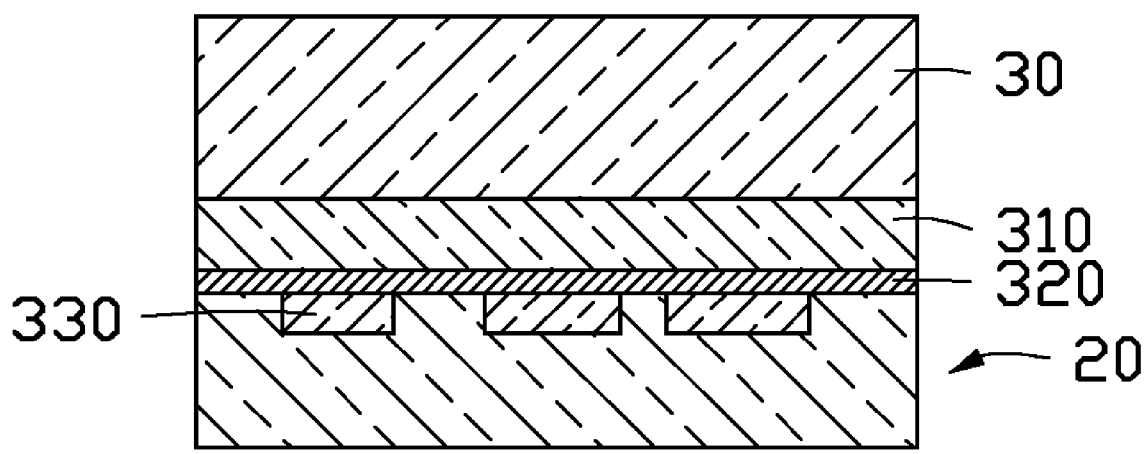
Figure 7C:
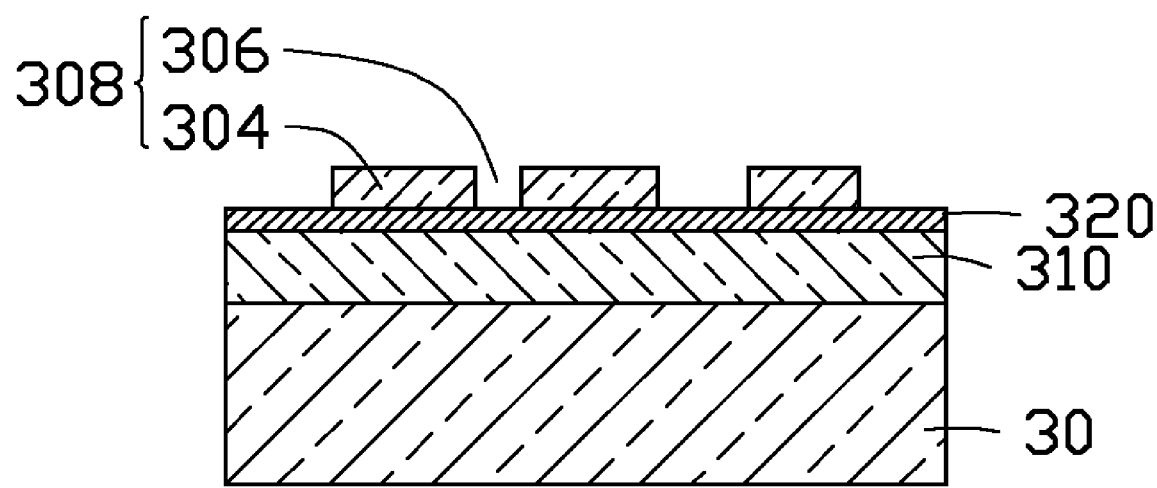
Figure 7D:
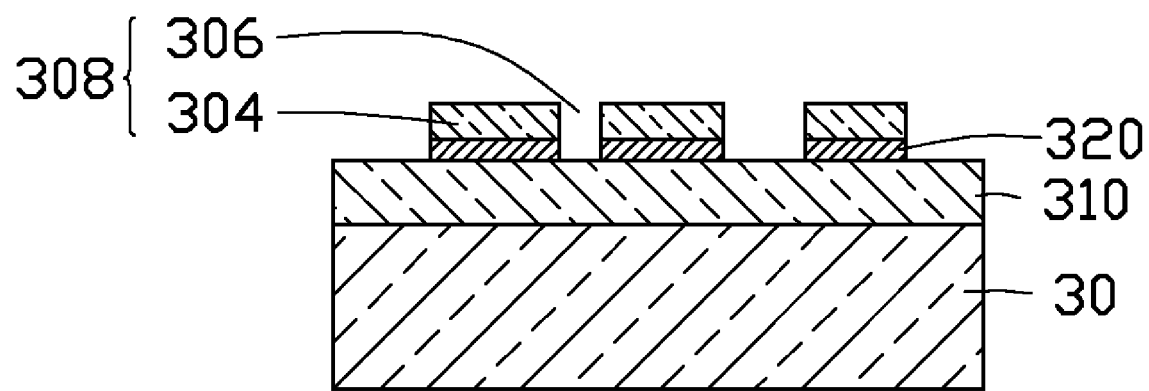
Figure 7E:
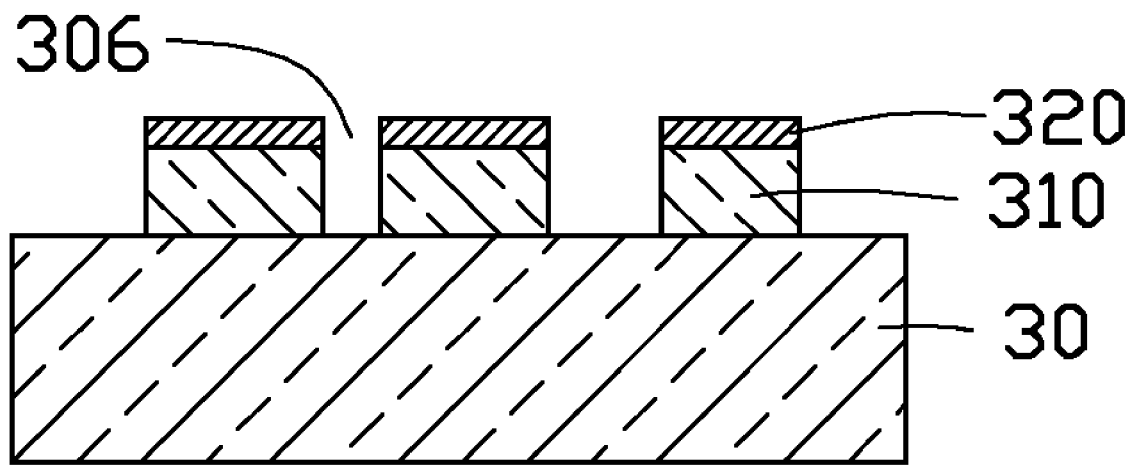
Figure 7F:
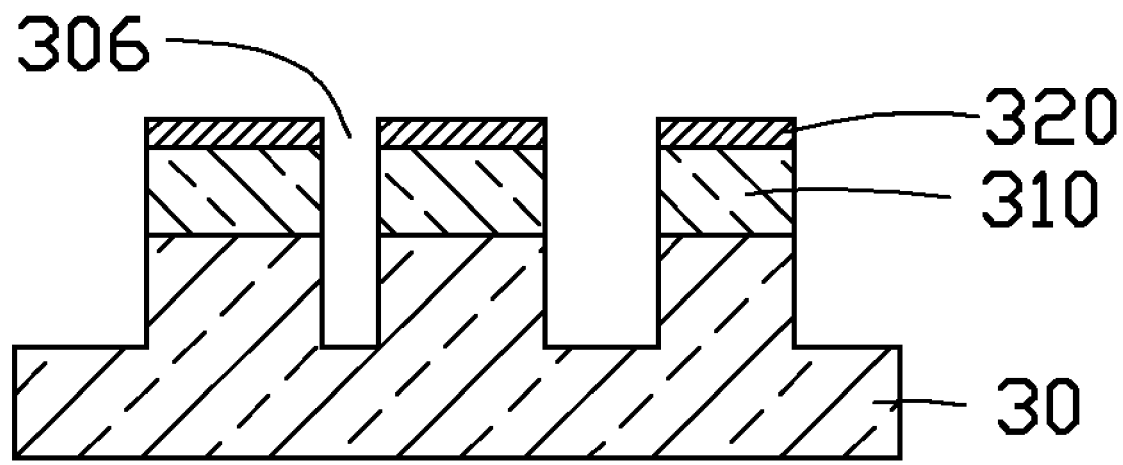
Figure 7G:
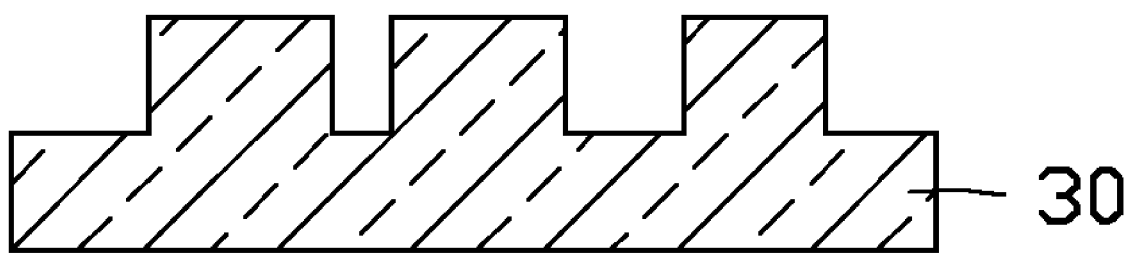

Referring to FIG. 6B, the step (S42) can be similar to step (S32).

In step (S43), the transferring process can be performed via etching method, step (S43) includes substeps of:

(S431) removing the remains of the resist 330 at the bottom of the recesses 306 to expose the substrate 30 in part;

(S432) etching the substrate 30 exposed by the recesses 306.

Referring to FIGS. 7A to 7G, one embodiment of a method of NIL includes:

(S51) providing a substrate 30 and orderly forming a first sacrifice layer 310 and a second sacrifice layer 320 on the substrate 30;

(S52) providing a master stamp 20 with a nanopattern 208, and depositing a resist 330 on the nanopattern 208;

(S53) attaching the second sacrifice layer 320 to the resist 330, forming a nanopattern 308 in the resist 330; and (S54) transferring the nanopattern 308 to the substrate 30.

The method of forming the first and second sacrifice layers 310, 320 on the substrate 30 can be same as step (S31).

Step (S52) can be performed in a vacuum environment to make the polymer compound 110 can be fully fill the gaps 26 of the master stamp 20.

The step (S53) includes substeps of:

(S531) compressing the master stamp 20 with the substrate 30 to press the nanopattern 208 into the resist 330, and attaching the second sacrifice layer 320 to the resist 330;

(S532) curing the resist 330, separating the master stamp 20 from the substrate 30 to form a nanopattern 308 in the resist 330.

Depending on the embodiment, certain of the steps of methods described may be removed, others may be added, and the sequence of steps may be altered. It is also to be understood that the above description and the claims drawn to a method may include some indication in reference to certain steps. However, the indication used is only to be viewed for identification purposes and not as a suggestion as to an order for the steps.

Finally, it is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. A nanoimprint mold comprising:
a flexible body; and
a molding layer located on the flexible body, the molding layer comprising a plurality of protrusions and a plurality of recesses; the molding layer being a polymer material polymerized via a cross linking polymerization of a nanoimprint resist; the nanoimprint resist is a compound comprising a hyperbranched oligomer (HP), a perfluoropolyether (PFPE), a methylmethacrylate (MMA), a diluent solvent and a photo initiator.

2. The nanoimprint mold of claim 1, wherein the HP is polymerized either by a copolymerization of trimellitic anhydride, ethylene mercaptan, and epoxy acrylic acid, or by a ring-opening copolymerization epoxy acrylic acid and ethylene glycol.

3. The nanoimprint mold of claim 2, wherein a chemical structure of the HP is:

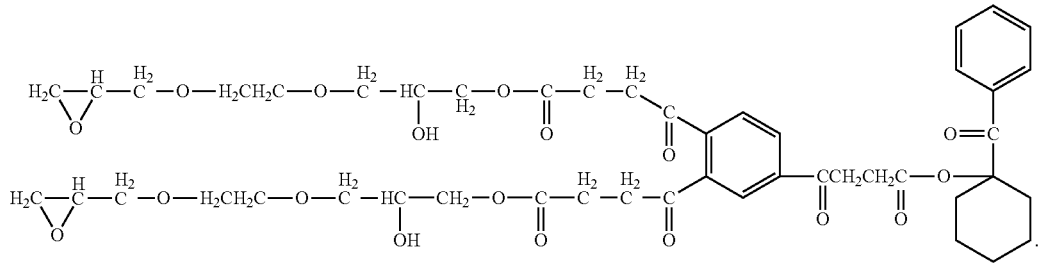

4. The nanoimprint mold of claim 1, wherein the diluent solvent is 2-hydroxyethyl methacrylate or 2-Hydroxy Ethyl 2-methyl ethylene.

5. The nanoimprint mold of claim 1, the nanoimprint resist comprises a weight percent of the HP is in a range from about 50 wt % to about 60 wt %, a weight percent of the PFPE is in a range from about 3 wt % to about 5 wt %, a weight percent of the MMA is in a range from about 5 wt % to about 10 wt %, a weight percent of the diluents solvent is in a range from about 25 wt % to about 35 wt %, and a weight percent of the photo initiator is in a range from about 0.1% to about 2%.

6. The nanoimprint mold of claim 5, further comprising an adhesive layer located between the molding layer and the flexible body, wherein the adhesive layer is made of methacrylatesilane.

7. The nanoimprint mold of claim 1, wherein the flexible body is made of flexible transparent polymer materials.

8. The nanoimprint mold of claim 7, wherein the flexible transparent polymer materials is selected from the group consisting of silicone rubber, polyurethane, epoxy resin, poly methyl methacrylate, and polyethylene terephthalate (PET).

* * * * *